United States Patent
Marino et al.

(10) Patent No.: US 6,526,365 B1
(45) Date of Patent: Feb. 25, 2003

(54) LOW-POWER/WIDEBAND TRANSFER FUNCTION MEASUREMENT METHOD AND APPARATUS

(75) Inventors: Michael A. Marino, Long Beach, CA (US); Parviz Parhami, Huntington Beach, CA (US); John T. Robinson, Laguna Beach, CA (US)

(73) Assignee: Scientific Applications & Research Assiociates, Inc., Huntington Beach, CA (US)

( * ) Notice: Subject to any disclaimer, the term of this patent is extended or adjusted under 35 U.S.C. 154(b) by 0 days.

(21) Appl. No.: 09/141,964

(22) Filed: Aug. 28, 1998

(51) Int. Cl.[7] .................................................. G01D 3/00
(52) U.S. Cl. ...................... 702/111; 702/109; 702/110; 702/188; 340/870.14; 455/226.1
(58) Field of Search .......................... 702/111, 108–110, 702/112, 66, 69–79, 106, 116–126, 179, 181–186, 188, 190, 191, 195, 197, 189, FOR 164, FOR 166, FOR 168, FOR 170, FOR 171, FOR 135, FOR 138, FOR 139, FOR 107–FOR 110; 709/248, 250, 252; 708/405, 271, 322, 821; 324/615–619, 637, 638, 76.14, 76.17, 76.19, 76.21, 76.22, 76.56, 76.57, 76.78; 346/37, 33 WL, 33 A, 33 B, 33 C, 44; 455/3.1, 3.2, 4.1, 5.1, 6.1, 6.3, 7, 9, 13.1, 13.2, 18, 23, 39, 42, 43, 63, 66, 67.1, 67.3–67.6, 76, 132, 165.1, 183.2, 208, 226.1–226.4, 260; 340/870.12–870.15, 870.18, 870.19, 870.25, 870.26, 825.19, 825.2, 825.7, 825.71, 825.72, 825.73, 825.79, 286.02; 359/110, 118–121, 123, 125, 135–137, 143, 145, 146, 148, 154, 157, 158, 164, 167, 172, 177, 178, 181–184; 370/241–243, 245, 252, 281, 289, 324, 425, 906, FOR 106, FOR 179; 375/354, 356, 357, 358, 359, 362, 364

(56) References Cited

U.S. PATENT DOCUMENTS

| | | | | |
|---|---|---|---|---|
| 4,663,744 A | * | 5/1987 | Russell et al. | 340/870.14 |
| 5,251,155 A | * | 10/1993 | Adachi | 702/110 |
| 5,399,976 A | * | 3/1995 | Wardle | 702/109 |
| 5,471,146 A | * | 11/1995 | Krayeski et al. | 455/226.1 |
| 5,731,699 A | * | 3/1998 | O'Byrne | 324/76.19 |
| 5,991,622 A | * | 11/1999 | Henry, Jr. | 455/165.1 |

OTHER PUBLICATIONS

Bendat et al., "Engineering Applications of Correlation and Spectral Analysis," second edition, John Wiley & Sons, pp. 70–77, 1993 (No month).*

Hayes, "Statistical Digital Signal Processing and Modeling," first edition, John Wiley & Sons, pp. 128–203, 492–555, 1996 (No month).*

Evaluation Engineering Reader Choice Awards: Eight Products Win Honors From Readers, 3 pages, 1999 (no month).*

Heart Conference Meritorious Paper Award, Parhami et al., 8 pages, Mar. 1999.*

"PC-Based EMI Tool Can Ease RF-Compliance Measurements," ChipCenter Product of the Week Award, pp. 1–4, Jan 24, 2000.*

Ambient Cancellation/Source Localization, CASSPER, product I. Yeng Kine, 12 pages, 2000 (no month).*

CASSPER RF Analyzer, product I. Yeng Kine, 4 pages, no date.*

* cited by examiner

*Primary Examiner*—Hal Wachsman
(74) *Attorney, Agent, or Firm*—John J. Murphey (57) ABSTRACT

The invention is a method of measuring transfer functions of a physical system using a wideband excitation signal by exciting the system with a low-power, wide band input signal that has a rich frequency content over a wide band and using a stochastic process to derive a system transfer function over the excitation signal bandwidth.

47 Claims, 7 Drawing Sheets

Figure 1.

PRIOR ART

PRIOR ART

LOW-POWER/WIDEBAND TRANSFER FUNCTION MEASUREMENT METHOD AND APPARATUS

BACKGROUND OF THE INVENTION

1. Field of the Invention

This invention generally relates to the area of electronic test equipment. More specifically, it pertains to devices that are capable of measuring "transfer functions", i.e., functions that are an indication of a system's response to electromagnetic radiation. These test devices are commonly known as Network Analyzers.

2. Description of the Prior Art

We live in a sea of electromagnetic radiation. If we could visualize the radiation swirling about us, we would see every electrical circuit and every electrical system putting out its own radiation. Unfortunately, some of this radiation affects equipment that we depend on, such as our office computers, computer-controlled machines, and radio and television equipment. It is important, therefore, to be able to explore the radiation that will possibly impact our equipment and predict whether the equipment will be adversely affected by the radiation or whether the steps we have taken to protect the equipment, such as using conducting seals and grounding devices, will provide the necessary protection.

As our society becomes more laden with electronic wizardry, this task becomes even more important. Will your computer shut down when you turn on your new cellular telephone? Will your pacemaker malfunction when you turn on the microwave oven? With respect to electronic-intenisive equipment, such as aircraft and water craft navigational instruments, would nearby lightning or operating a computer on board adversely affect the usefulness of the equipment?

In order for industry to warrant the operation of their products, such as computers, computer-controlled machines, navigation instruments, cellular telephones and the like, the effects of external radiation on the particular device must be determined, and procedures or measures taken to prevent this radiation from corrupting the operation of the device. In order to market many electronic devices in the United States, the Federal Communications Commission (FCC) rules require certification against the external electromagnetic radiation effects. European Union rules and regulations require more stringent certification requirements for Electromagnetic Interference and Compatibility (EMI/EMC) applicable to all consumer and industrial equipment.

Figure 1:
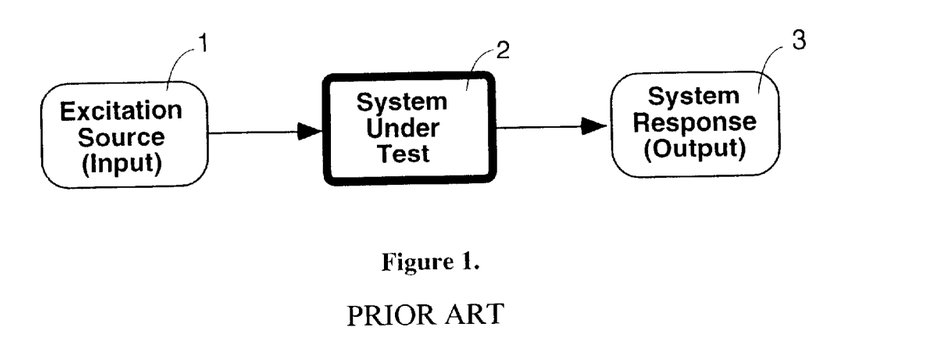
FIG. 1 is a schematic diagram showing the general layout of a transfer function.

The interference caused by electromagnetic radiation can be characterized by measuring a quantity called. "transfer function" also known as "transfer characteristics" or "impulse responses". Transfer functions, in general, characterize a system by relating the system's response (output) to a given excitation (input). This is depicted in FIG. 1. Transfer function determination requires one signal (for exciting the system under test) and two measurements (the excitation and response). In FIG. 1, the excitation source or signal 1 (such as electromagnetic or acoustic radiation) is inputted to the system 2 under test (such as an aircraft, a computer, or a building) to bring about a response 3 (such as current or voltage induced on a cable or acoustic intensity in a chamber). The transfer function is defined as the ratio of the output signal response 3 to the input signal 1, and must be determined for each excitation frequency. For example, a piano's transfer function can be determined by striking the keys. To make a complete transfer function, the piano response must be determined for each and every key; each key representing a different frequency. Examples of practical applications for transfer function measurements are to:

a) Characterize electronic filters;

b) Characterize mechanical vibrations of structures (such as automobile suspensions or bridges);

c) Characterize concert hall echoes;

d) Determine acoustic shielding effectiveness (blockage of sound) of enclosures; and, e) Determine electromagnetic shielding effectiveness of automobiles, aircraft, buildings, missiles etc . . . .

The prior art utilizes two primary techniques in conjunction with a centralized data to acquisition and processing apparatus for measuring these transfer functions:

High-Pitier/Ultra-Wideband Test Technique

The high-power/ultra-wideband technique excites the system with a short duration pulse (called an "impulse"). Because any impulse has a frequency content that is extremely rich, i.e., contains many frequencies, one measurement contains transfer function information over a wide band of frequencies. The system transfer function is determined by computing the system's response to the impulse using a data processing technique such as the Fourier transformation technique. This is a fast measurement technique because the transfer function can be determined over a large frequency range using only one pulse.

Impulse excitation does not use up-conversion techniques to modulate the wideband pulse onto a carrier frequency. The pulse is used as the direct excitation source and the frequency range of the measurement is inversely proportional to the duration of the impulse. Therefore, increasing the frequency range of the measurement requires decreasing the impulse width. This places a limit on the maximum frequency that this method can be used because of practical limitations in narrowing the pulse due to electronic component limitations.

The processing method used for this technique (Fourier transform) does not give any data quality indication. This requires the operator to set the excitation power to levels that are higher than necessary in order to guarantee that noise does not corrupt the data. High-power amplifiers are required to boost the signal power of the impulse, because the transmitted pulse has a very short duration.

There are several drawbacks to this high-power/ultra-wideband method:

a) High-power amplifiers are expensive;

b) Ultra-wideband electronic components are unavailable or expensive;

c) High-power pulses can be hazardous to humans;.

d) High-power pulses can cause interference with other electronic systems;

e) The maximum frequency range is inherently limited; and, f) Noise, which is a practical consideration in all measurements, can corrupt the transfer function, sometimes without the operator's knowledge.

Low Power/Narrow band or Continuous Wave (CW) Test Technique

The low-power/narrowband technique, commonly referred to as continuous wave (CW) testing, is the most popular technique used. This technique excites the system with a signal that is comprised of one dominant frequency (called a "tone"). This is similar to one piano key struck and your ear hearing only one dominant tone. The system transfer function is determined by measuring the system's response to the tone. A complete transfer function requires a tone to be transmitted at each and every frequency of interest.

The processing method used for this technique does not give any data quality indication. This requires the operator to set the excitation power to levels that are higher than necessary in order to guarantee that noise does not corrupt the data.

There are several drawbacks to this low-power/narrowband method:

a) Testing over a large frequency span is very slow due to the excessive number of individual tones that are required;

b) Transmitting tones can cause interference with other electronic systems;

c) Vital transfer function information can be missed due to the frequency stepping nature of the testing sequence; and, d) Noise, which is a practical consideration in all measurements, can corrupt the transfer function, sometimes without the operator's knowledge.

Centralized Data Acquisition and Processing Apparatus

Figure 2:
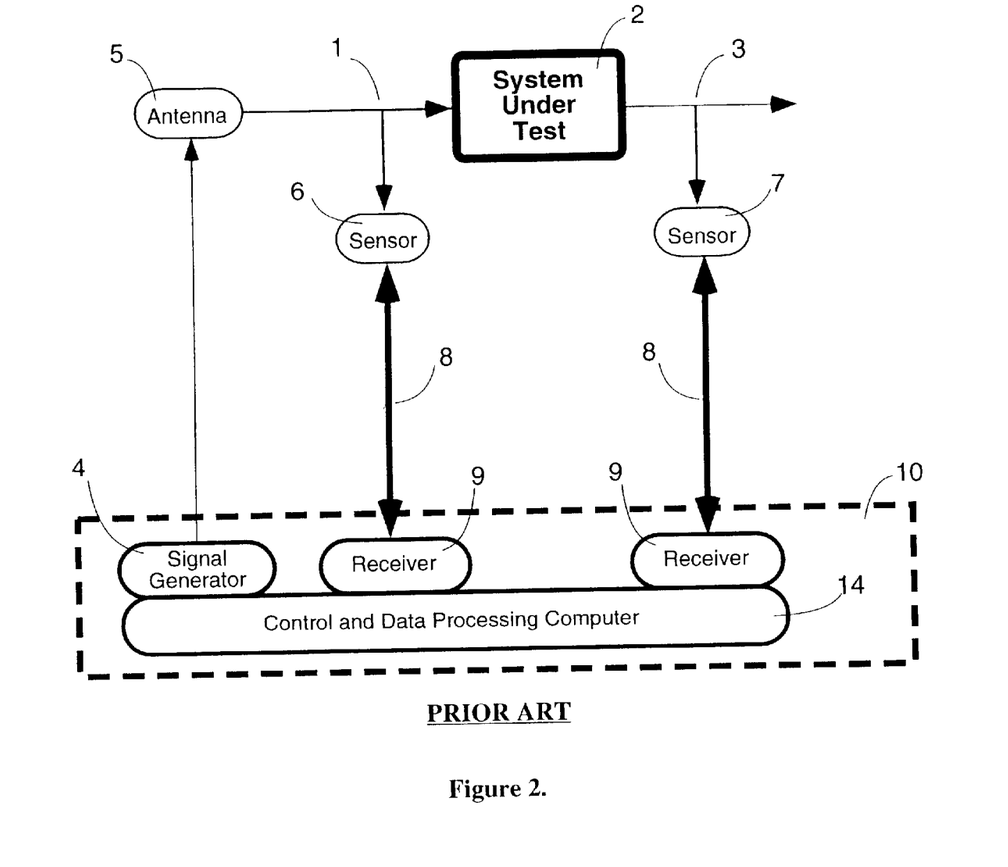
FIG. 2 is a schematic diagram of the typical prior art method of determining a transfer function which uses a centralized instrumentation system.

For large and complex systems under test, the prior art utilizes a centralized data acquisition and processing apparatus to implement the standard transfer function setup shown in FIG. 2.

A signal generator 4 generates a controlled excitation signal 1 and sends it via an antenna 5 to radiate the system 2 under test to produce the system response 3. An amplifier (not shown) may be used to increase the strength of the excitation signal. Sensors 6 and 7 (e.g., field probes, current and voltage sensors or acoustic transducers) detect the input signal and the output response signal respectively and send them via analog telemetry links 8 (e.g., wideband analog fiber optic cables) to receivers 9 (e.g., high speed digitizers, Network Analyzers, Spectrum Analyzers) to simultaneously monitor and record the excitation as well as the system response signals. Signal generator 4 and receivers 9 are usually located in a centralized location away from the system 2 under test in a protected enclosure 10 shielded from the collateral effects of the RF radiation as radiated by the antenna 5 as well as other ambient radiation sources. While the currents or voltages are sensed at the desired locations in the system under test, they are actually recorded at the centrally located receivers.

When the high-power/ultra-wideband technique is used, the transmitter or signal generator 4, consisting of a wideband high amplitude pulser; the receivers 9, which typically consist of high speed digitizers; and the data acquisition computer 14 are located together in the centralized shielded enclosure. The wideband transmitting antenna 5 is located outside the shielded enclosure 10. The sensed excitation and system responses are relayed in analog form to the centrally located receivers 9 via links 8 which have utilized analog microwave or fiber optic telemetry technologies. While the currents or voltages are sensed at the desired location in the system under test, they are actually recorded at the centrally located receivers 9 (high speed digitizers).

When the low-power/narrowband or CW technique is utilized, the computer 14, signal generator 4 and two receivers 9 are built into a single commercially available instrument such as a Network Analyzer. This instrument typically contains one source signal output port, and two input ports for the receivers. Usually a third receiver port is included to enable simultaneous measurement of a reference signal, if desired. The generated source signal is relayed to a radiation device 5 located outside the shielded enclosure 10, and an amplifier is generally used to increase the signal level as necessary to produce measurable signal levels in the system 2 under test. Again, while the currents or voltages are sensed at the desired location in the system under test, they are actually recorded at the centrally located receivers (Network Analyzer).

There are several drawbacks to this centralized data acquisition and processing:

a) Sensor data can only be relayed from the test point location to the receiver using analog telemetry because the signal is not recorded until it arrives at the receiver input port;

b) Analog telemetry links have a relatively small dynamic range, typically 40 dB, which reduces the fidelity of the desired sensed signals;

c) Attenuators or preamplifiers must be used to adjust the sensed signal until its peak amplitude is within the linear range of the analog telemetry link;

d) It takes a long time to measure a transfer function over the full frequency range of interest because the Network Analyzer must dwell longer at each frequency to make up for the poor dynamic range of the analog telemetry links;

e) Analog fiber optic telemetry links with operational bandwidth of hundreds of MHz are very expensive due, in part, to the high cost of wideband fiber optic cable. The analog fiber optic telemetry links with bandwidths exceeding 1 GHz are extremely expensive, highly unreliable and not widely available; and, f) The number of receivers that simultaneously can reliably measure frequency and phase-locked responses at multiple test points (locations) within the system under test is limited to three received channels in a common Network Analyzer instrument.

U.S. Pat. No. 5,086,616 "Monitoring Process and Dice of a Quasi-Closed Electromagnet Shield" discloses a measurement system, however, the source of the radiation is retained inside the enclosure, the frequency range is limited to 1 to 100 KHz, and the source is low power.

SUMMARY OF THE INVENTION

This invention is a low-power/wideband (LPWB) transfer function measurement method and a distributed data acquisition and processing apparatus with which to perform the aforesaid method. The method uses a completely new approach in the art—Stochastic Process Test Technique (SPTT)—for deriving transfer functions and a distributed, rather than centrally located, instrumentation apparatus to manage the test process.

In the invention, an advanced stochastic processing test technique (SPTT) enables determination of transfer functions using LPWB-schemes. The system is excited by being radiated with a low power pseudo-random signal that has a concentrated frequency content over a wide, continuous band (wideband). The bandwidth of this signal can be Lip to several thousand times larger than a CW tone. Therefore, one LPWB pulse can excite the system with the equivalent of thousands of CW tones. This has the advantage of greatly decreasing the time required to make transfer function measurements. Interference with other electronic devices is considerably reduced, because the low power excitation signal has a structure that is similar to noise. Since the excitation is over a continuous band, as opposed to CW which changes frequency in discrete steps, detailed transfer function information is not missed.

LPWB uses a wideband excitation baseband signal and an up-conversion process to operate at frequencies that are greater than the highest modulation frequency of the baseband. The up-conversion process shifts the baseband excitation signal upward to the various frequency bands of interest. By using this method, transfer function determination can be made at frequencies above the baseband modulation frequency, thus removing the limitation associated with impulse testing, while making measurements across a wide frequency range, thus improving on the speed limitation of CW testing. The receivers use a corresponding down-conversion process to demodulate the received signal to the original baseband modulation bandwidth before recording. This down-conversion technique allows low cost, low frequency electronic components to be used for recording and telemetry needs.

Low-power excitation measurements are possible because of the excitation signal duration and the SPTT transfer function data processing method used. A high-power short duration pulse has the equivalent average power of a low-power, long duration pulse. Because the LPWB excitation signal has a duration. which is much longer than an impulse's duration, measurements can be made at low-power when compared to the high-power/ultra-wideband test technique. Additionally, although the LPWB excitation signal has a significantly wider bandwidth than the CW excitation signal, such that the LPWB radiated power is distributed over. the entire frequency bandwidth resulting in a much lower power density at each frequency when compared to the low power/narrowband or CW test technique, the SPTT transfer function data processing method prevents corruption of the transfer function due to noise.

As part of the SPTT transfer function data processing, a "coherence function" is computed. The coherence function is an indicator of the correlation between the two measurements (input and output). Since random noise is by definition uncorrelated, the coherence function allows measurements that are corrupted by noise to be identified and rejected, as well as being able to identifying good quality data. Therefore, excitation power levels can be significantly reduced without unknowingly compromising measurement quality.

Ambient signals, such as man-made radiators (TV and radio stations), can be used as the system excitation, which is a feature that is unique to LPWB. Transfer function measurements that can be made without active excitation signals are the best type of non-interfering measurements because no external, potentially interfering signals are produced by the instrumentation system. The coherence function makes ambient excitation feasible because it can identify and isolate the correlated ambient man-made radiators from other uncorrelated random noise sources.

The advantages of the LPWB inventive method over the impulse technique are:
 a) Reduced equipment cost due to low-power excitation levels;
 b) Reduced equipment cost due to non-impulse excitation;
 c) Reduced health risks because low-power levels are used;
 d) Reduced interference. with other systems due to the low-power of the excitation signal;
 e) The maximum test frequency is not limited because of the up-conversion/down-conversion techniques;
 f) Noise corrupted data is indicated by the coherence function and may be readily rejected; and,
 g) Ambient excitation can be used for transfer function derivation.

The advantages of this inventive method over the CW technique are:
 a) Decreased testing time due to the wideband nature of this method;
 b) Reduced interference with other systems due to the low-power and noise-like nature of the excitation signal;
 c) Vital transfer function information will not be missed due to the continuous frequency coverage of the wideband nature of this technique;
 d) Noise corrupted data is indicated by the coherence function and may be readily rejected; and,
 e) Ambient excitation can be used for transfer function derivation.

Figure 3:
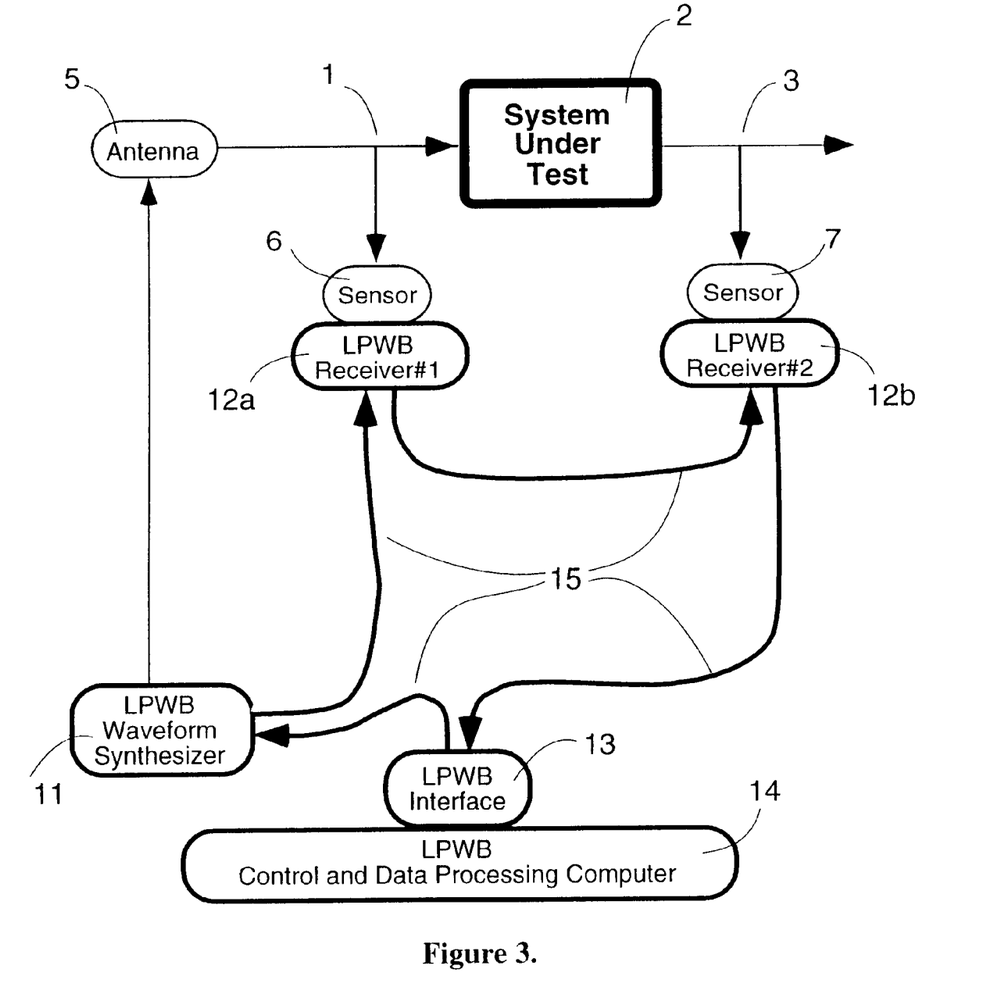
FIG. 3 is a schematic diagram of the preferred embodiment of the transfer function measurement setup of this invention which uses a distributed instrumentation system.

In this invention, data acquisition and processing are performed in a distributed versus centralized manner. Receivers are installed near each location in the system under test where a response measurement is desired. Because the invention uses wideband modulated signals, the signal generator used in the prior art is replaced with a waveform synthesizer. The excitation and system responses are sensed using appropriate current or voltage probes and the sensor signals are measured at the test point location rather than relayed to a central location for measurement, as is the case with the prior art. The measured signals are down-converted, digitized and relayed to a centralized test control location in digital, versus wideband analog, form. A typical transfer function test setup using the invention is shown in FIG. 3. The waveform synthesizers and receivers are centrally controlled such that all transmitted and received signals are time and frequency synchronized.

The advantages of this inventive method over the centralized data acquisition and processing apparatus are:
 a) Data can be relayed from: the test point location to the central processor using low cost digital telemetry links, avoiding the dynamic range and high frequency limitation problems encountered by the analog telemetry links;
 b) The dynamic range of the receiver, typically 110 dB or more, far exceeds the 40 dB dynamic range of analog telemetry links;
 c) Automated Gain Control (AGC) are built-into each receiver and transparent to the telemetry link operation. The telemetry's digital signals have a constant amplitude and thus do not require constant adjustments when measuring different signal strengths;
 d) Digital relay links are more reliable and less costly than their wideband analog counter-parts;
 e) Receivers can be placed at greatly disbursed locations, on the order of kilometers, which is impractical with the prior art;
 f) The number of receivers that can reliably simultaneously measure frequency and phase locked responses at various test points (locations) within the system under test is virtually unlimited. Increasing the number of simultaneous data channels with the prior art is cost prohibitive; and,
 g) All waveform synthesizer and receiver modules in the apparatus are time and frequency synchronized and, as a, group, effectively behave as a single instrument. Synchronization of prior art instrumentation systems are cumbersome if not impossible.

Accordingly, the main object of this invention is a method of measuring transfer functions using low-power/wideband excitation and a distributed apparatus for practicing the method. Other objects of the invention include a method of measuring transfer functions using wideband excitation; a method of measuring transfer functions with an indication of measurement quality; a method of measuring transfer functions with the capability of rejecting corrupted data; a method of measuring transfer functions under conditions where environmental (ambient) excitation can be utilized; a method of measuring transfer functions without interfering with other electronic devices; a method of measuring transfer functions without causing a health; risk; a method of measuring transfer functions over wide bandwidths without measuring one individual frequency at a time; and a method for implementing a modular distributed instrumentation architecture.

Still further objects of this invention are an unique general purpose physically distributed apparatus for using low-power, wideband radiation to excite a system and determining system's responses to the excitation; comprised of a waveform synthesizer, for transmitting the input low-power wideband radiation to excite a system; multiple receivers, for measuring the system input and output; a digital computer, for controlling the waveform synthesizer and receiver operations and calculating the system characterizations, such as system transfer functions, from the measured data; and a digital fiber optics telemetry system to facilitate communication and synchronization between the physically distributed waveform synthesizers, receivers, and the computer.

These and other objects of the invention may be determined by reading the description of the preferred embodiments along with the drawings attached hereto. The scope of protection sought by the inventor may be gleaned from a fair reading of the claims that conclude this specification.

DESCRIPTION OF THE PREFERRED EMBODIMENT

The term "system" (to be tested) is used herein to define a set or arrangement of things so related or connected as to form a unity or organic whole. This may be an arrangement of navigational instruments that operates a guided missile, an aircraft or watercraft; an arrangement of electrical and electronic systems that comprise a communications or general office facility; an arrangement of computer subcomponents that operate as a personal computer; etc. Likewise, the distributed apparatus described herein to perform the method of measuring transfer functions of systems act itself like a system, i.e., the computer, interface module, waveform synthesizer module, and receiver modules, form a unity and operate as a completely single unit. However to reduce confusion, the term "apparatus" will be used to describe the assembled distributed modules of this invention.

Turning now to the drawings wherein components are identified by numbers and like components are identified by like numbers throughout the thirteen drawings, one can observe in FIG. 2 that the prior art CW test technique transfer function measurement setup requires a signal generator 4 and an antenna 5 that provide an excitation input 1 to the system 2 to produce a response 3, where the input is picked up by a sensor 6 and the system's response is picked up by sensor 7, said sensors 6 and 7 sending their signals through analog telemetry 8 into respective separate receivers 9 for passing to control and data processing computer 14.

The term "stochastic process test technique (SPTT)" refers to a family of signal processing algorithms and methods for estimating transfer functions from recorded time series data. For the purposes of this invention, SPTT algorithms include both "non-parametric" as well as "parametric" methods. The "non-parametric" methods assume no prior knowledge of, the system 2 under test and, therefore, are applicable to a large class of systems. The "parametric" methods, on the other hand, assume some specific knowledge of the system under test (e.g. physical constraints on system responses) resulting in faster and more efficient algorithms as compared to the "non-parametric" methods, but are applicable to a limited class of systems under test.

The preferred embodiment apparatus described in this section will be described in terms of the functional block diagrams in FIGS. 4–13. The individual functional blocks in FIGS. 4–13 are broken down to a level of detail necessary for the reconstruction of the preferred embodiment apparatus using 1998 vintage off-the-shelf electronic components by those skilled in the art of digital and RF electronics design and development. The specific SPTT signal processing algorithms called for by the preferred embodiment have been published in modern signal processing open literature and, therefore, can be recreated by those skilled in the art of signal processing.

LPWB System

The LPWB method of this invention is shown in FIG. 3 and provides for the use of an apparatus comprising three basic modules: the LPWB waveform synthesizer 11, the LPWB receivers 12a and 12b, and an LPWB interface 13. LPWB waveform synthesizer module 11 synthesizes a programmable wideband waveform, and up-converts the synthesized waveform to the center frequency of interest. Waveform synthesizer module 11 causes antenna 5 to broadcast a signal which excites system 2 under test. LPWB receiver modules 12a and 12b measure respectively the excitation signal to system 2 (input) and responsive signal 3 from the system (output). LPWB receiver modules 12a and 12b down-convert, digitize, and store the received wideband signal about the center frequency of interest. The stored data are then relayed to control computer 14 via a digital telemetry link 15. The minimum or standard test configuration uses two receiver modules 12a and 12b. One receiver module 12a measures the excitation signal and one or more receiver modules 12b measure the system responses to the excitation signal.

Interface module 13 is used so that the LPWB system can communicate with computer 14. LPWB interface module 13 is a bridge between computer 14 and telemetry link 15. The communication protocol between computer 14 and LPWB interface module 13 in the preferred embodiment is the industry standard GPIB (General Purpose Interface Bus also referred to as IEEE-488).

Computer 14 is an integral part of the system because all LPWB modules are controlled and configured by computer 14. Software, which is operating computer 14, sends the appropriate control signals through the interface module 13 and then processes the data that is measured by receivers 12a and 12b, and computes the transfer function and coherence function. Computer 14 acts like a front-panel for the LPWB system, which means it accepts an operator's selections and requests, and displays the test results on the screen. LPWB computer 14 performs all module control functions as well as the SPTT calculations. In the preferred embodiment, software, such as LABVIEW® software development environment, published by National Instruments, is used to program LPWB control software as well as SPTT signal processing algorithms.

Telemetry 15 is provided to LPWB waveform synthesizer 11 and receiver modules 12a and 12b so that they can communicate with each other and with computer 14 through interface module 13. Optical, RF and fiber optics telemetry links can be used since they provide electrical isolation between the modules. The preferred embodiment uses digital fiber optic telemetry 15 because of it's low cost and simplicity. The fiber optic link of the preferred embodiment sends information in digital format because analog telemetry is more susceptible to noise and has dynamic range limitations. The fiber optic telemetry 15 in the preferred embodiment is connected in a "daisy chain" architecture, which means it forms a closed ring (waveform synthesizer 11, receivers 12a and 12b, and interface 13). This is done so that more modules can be added to the daisy chain network without adding additional connections to interface module 13. For applications which require limited number of modules, a "star" network architecture can also be employed.

Digital telemetry 15 has two primary purposes: first, it enables digital communication between the LPWB modules and, second, it provides a reference clock to the LPWB modules for synchronized operation. The preferred embodiment uses off-the-shelf fiber optics with an analog bandwidth of 125 MHz in order to operate at a 3 MHz digital clock rate. The wider analog bandwidth is required in order to preserve the risetime of the digital pulse as it travels through the telemetry link 15. This is an essential consideration in order to maintain accurate frequency synchronization of the LPWB modules.

Figure 4:
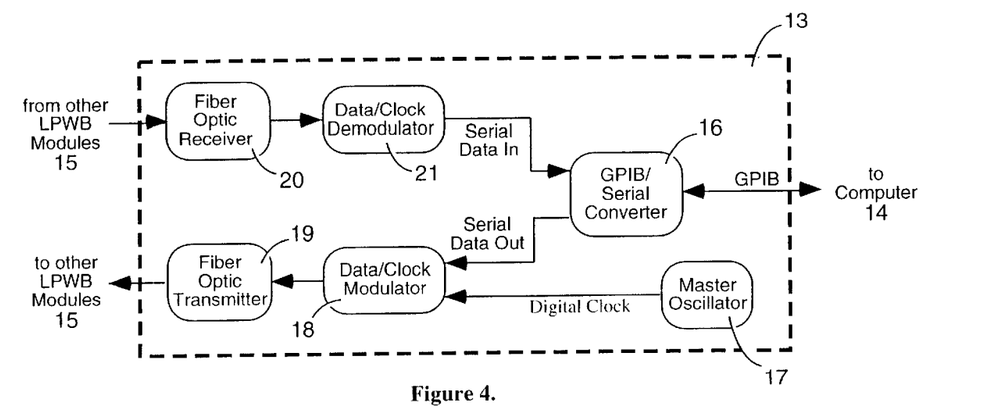
FIG. 4 is a functional block diagram of the preferred embodiment of the low-power/wideband ("LPWB") interface module of this invention.

LPWB Interface Module:

The preferred embodiment of the LPWB interface module 13 is shown. in FIG. 4. The interface module 13 serves two primary purposes. First, to provide a two-way communication bridge between fiber optics telemetry system 15 and control computer 14; and, second, to supply a master reference clock to all the LPWB modules connected to the fiber optics telemetry 14.

The communication protocol required for exchanging data with computer 14 can be in any number of popular formats such as: parallel, serial, GPIB, and Universal Serial Bus (USB), or Fire Wire. In the preferred embodiment, the GPIB protocol (also known as IEEE 488) has been selected since it is currently the most popular standard for controlling scientific instruments. The GPIB/serial converter 16 is provided in module 13 not only to provide two-way translation between serial and GPIB protocols, but also to manage the significant speed difference between the two data streams. The data rate in fiber optic telemetry system 14 is significantly faster than the standard GPIB data rate. An example of a converter to perform this function is a National Instruments GPIB-232CT-A. In the preferred embodiment, a digital signal processor (DSP) has been employed and programmed to perform the GPIB/serial converter 16 function at optimal speeds.

LPWB interface module 13 also contains a crystal or master oscillator 17 which produces a master oscillator or clock which all other modules use as a reference clock. By sending the same clock signal to all LPWB modules, full apparatus frequency synchronization is achieved. Synchronization is essential for the LPWB processing method to function properly. Without synchronization, the accuracy of SPTT algorithms deteriorate, for example, system coherence cannot be achieved and the coherence function will not indicate transfer function data quality. The selection of a master clock or oscillator frequency is dependent on the bandwidth of the fiber optic line. The preferred embodiment master oscillator 17 is selected to be 3 MHz so that widely available low cost fiber optics and electronic components can be used throughout the LPWB system. For instance, using a 3 MHz oscillator 17, a fiber optic transmitter 19 can be used that is an off-the-shelf item for transmitting data and clock through the telemetry link. An example of a transmitter usable herein is a Hewlett Packard model HFBR-1414 a fiber optic receiver 20 is provided for receiving data. An example of a fiber optic receiver 20 usable herein is a Hewlett Packard model HFBR-2416.

In the preferred embodiment, both the serial data and the clock are transmitted simultaneously by transmitter 19 along one fiber optic line 15 and received by a fiber optic receiver 20. This is achieved by an innovative modulation method which encodes the reference clock with the data stream by varying the reference clock's duty cycle. The clock signal is fed to a data/clock modulator 18 to be modulated by the serial output data. To transmit a data logic "0", the duty cycle of the clock is set to 25%. To transmit a data logic "1", the duty cycle of the clock is set to 75%.

On the receive side of the LPWB interface, the received signal is passed to a data/clock demodulator 21 to be demodulated using the inverse of the modulation technique described above. If the received reference clock signal has a duty cycle of 25% then the serial input data is set at logic 0. If the received reference clock signal has a duty cycle of 75% then the serial input data is set at logic 1. The serial input data is converted in converter 16 to GPIB and sent to the computer 14.

LPWB Waveform Synthesizer Module

Figure 5:
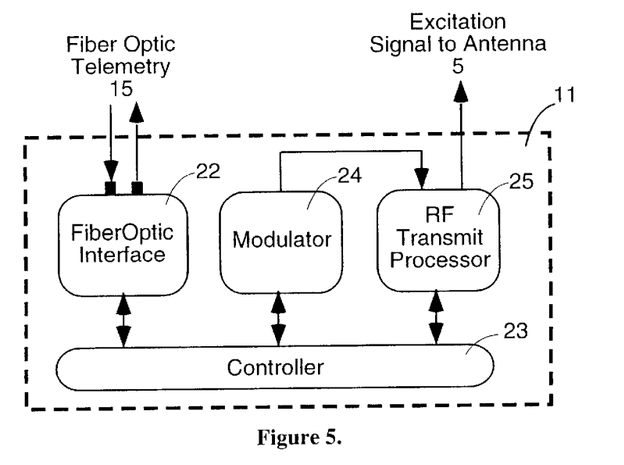
FIG. 5 is a functional block diagram of the preferred embodiment of the LPWB waveform synthesizer module of this invention.

A block diagram of The preferred embodiment of LPWB waveform synthesizer module 11 is shown in FIG. 5. A waveform synthesizer 11 is used in this invention instead of the traditional signal generator 4 because the synthesizer can simulate a wide variety of waveforms while the signal generator can only output a sine wave, or other traditional waveform, at specified frequencies.

Waveform synthesizer 11 is comprised of a fiber optic interface 22, a controller 23, a modulator 24 and an RF transmit processor 25. In the preferred embodiment, LPWB waveform synthesizer 11 generates output signals with a 3 MHz fully programmable modulation centered about a frequency range from 0 to 999 MHz. The. user defined modulation sequence is 65,536 bytes long for each of the in-phase and quadrature components which are transmitted from control computer 14 to modulator 24. Using these two long sequences, the waveform synthesizer produces the user specified 3 MHz wide modulated signal ranging from a narrowband CW (tone) signal to a wideband white noise (random) signal. The modulation types include: amplitude modulation, frequency modulation, and phase modulation. The modulated signal is up-converted to the center frequency of interest by RF transmit processor 25 and sent to transmitting antenna 5.

Figure 6:
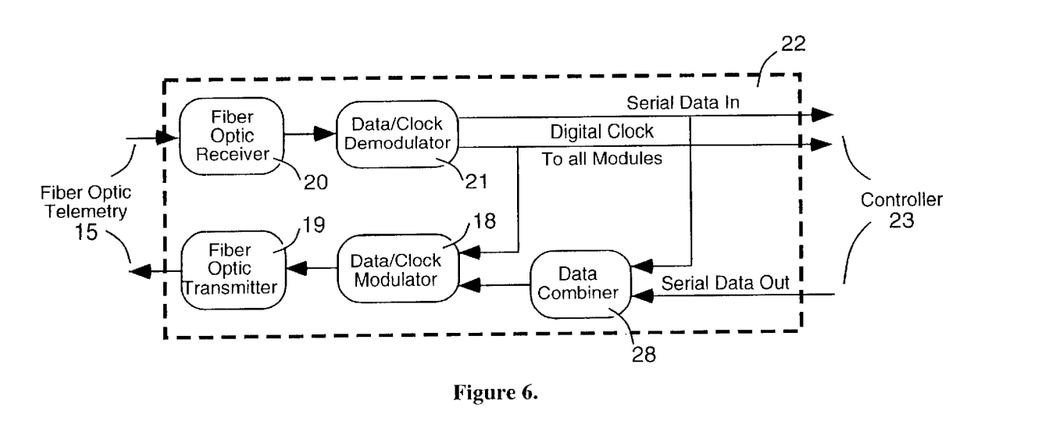
FIG. 6 is a functional block diagram of the preferred embodiment of the fiber optic interface circuit of this invention as used in the waveform synthesizer and receiver modules.
Figure 7:
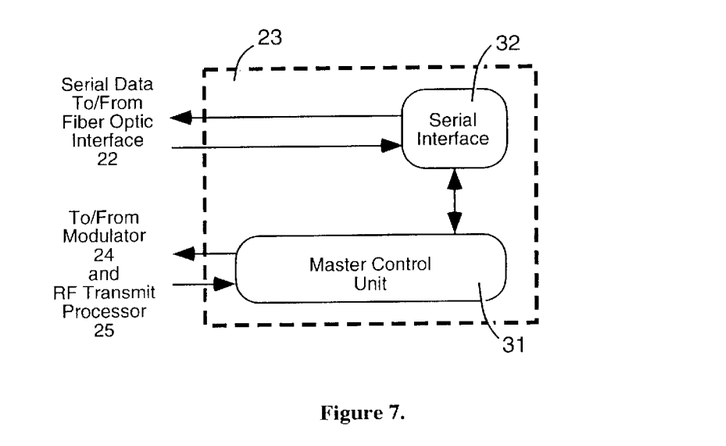
FIG. 7 is a functional block diagram of the preferred embodiment of the controller circuit of this invention as used in the waveform synthesizer and receiver modules.
Figure 8:
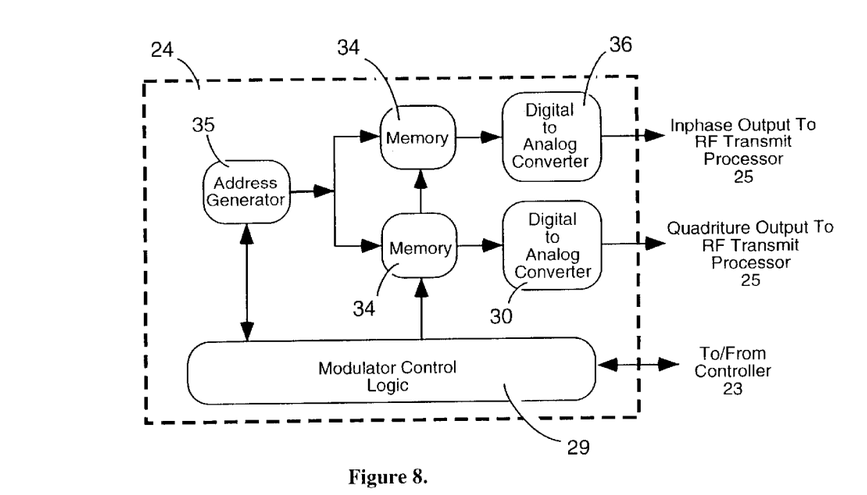
FIG. 8 is a functional block diagram of the preferred embodiment of the modulator circuit of this invention as used in the waveform synthesizer module.
Figure 9:
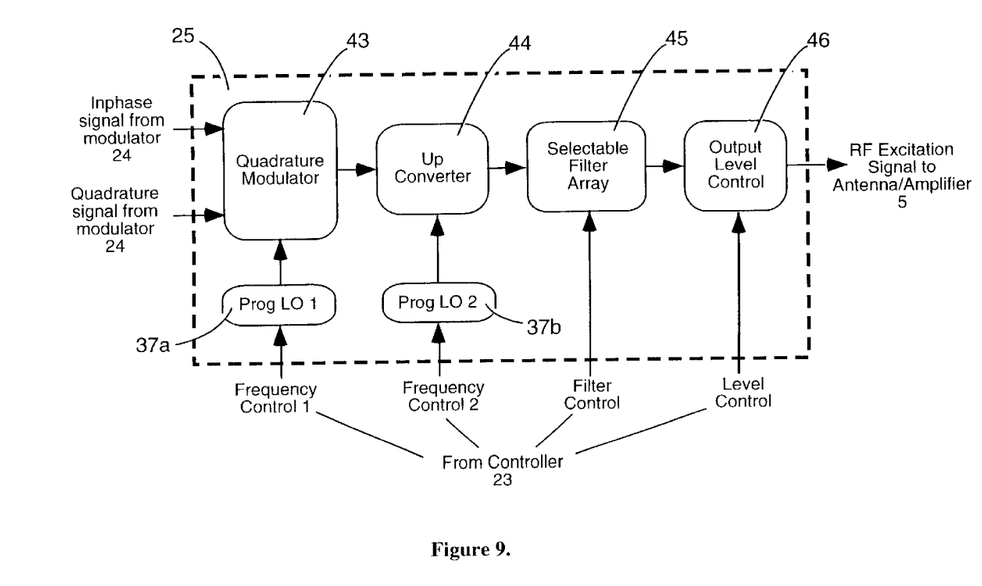
FIG. 9 is a functional block diagram of the preferred embodiment of the RF transmit processor circuit of this invention as used in the waveform synthesizer module.

Fiber optic interface 22 circuit is shown in FIG. 6; controller 23 circuit is shown in FIG. 7; modulator 24 circuit is shown in FIG. 8; and, RF transmit processor 25 circuit is shown in FIG. 9.

Fiber Optic Interface Circuit

The block diagram of the fiber optic interface board is shown in FIG. 6. It is very similar in concept and design to LPWB Interface module 13 and the fiber optic transmitter/receiver and the data/clock modulation/demodulation processes are the same, or almost the same, as the method described for LPWB interface module 13.

The signal from fiber optic telemetry link 15 is received by a fiber optic receiver 20 and is passed to a data/clock demodulator 21 and demodulated into the digital clock and the serial input data. The serial input data is sent to controller 23. The serial input data and the serial output data are sent to data combiner 28. The combined data is modulated with the digital clock by data/clock modulator 18 and retransmitted through fiber optic transmitter 19 for transmission to the next LPWB module. If the serial input data was not retransmitted, then only the first module in the loop would receive this data.

Controller Circuit Board

The block diagram of the circuit board of controller 23 is shown in FIG. 7. The primary functions of controller 23 are serial-to-parallel data conversion, interpreting the data sent by computer 14, and configuring the waveform synthesizer module as commanded by computer 14. The serial data is converted in serial interface 32 to parallel format and sent to master control unit 31. Master control unit 31 examines the address of the data because each LPWB module has a unique address. If the data is addressed to this LPWB module, then master control unit 31 determines the data type and configures the appropriate subsystem with this data. Examples of different data types are frequency, number of samples to acquire, attenuation level, and filter selection.

Serial interface 32 exchanges data with fiber optic interface 22 and master control unit 31 exchanges data with modulator 24 and RF transmit processor 25.

Modulator Circuit

The block diagram of modulator 24 is shown in FIG. 8. The primary function of modulator 24 is to receive digitized modulation waveform information from controller 23 and convert this data to analog format. The wideband pseudo-random modulation waveform resides on computer 14 in digital format. Computer 14 sends this data to LPWB interface module 13 which in turn sends it to waveform synthesizer 11. Controller 23 circuit module determines if the data is for modulator 24, and if so, transfers it to modulator 24. Modulator control logic 29 takes this data and loads it into a memory 34. In the preferred embodiment as shown in FIG. 8, memory 34 is comprised of Static Random Access Memory (SRAM) modules: An address generator 35 is provided generally comprised of a binary counter (not shown) that can count sequentially. The digital SRAM data from each memory is passed onto a digital-to-analog (D/A) converters 30 and 36 that take the digital SRAM data, one sample at a time, and convert it into an analog signal. The preferred embodiment uses 12 bit D/A converters running at a 12 MHz clock speed which is an exact multiple of master oscillator 17 clock signal that was received by fiber optic interface 22.

Memory loading is accomplished by resetting address generator 35 to zero and commanding it to start counting in increments of one. The SRAM memory modules 35 are put into their "write" mode so the waveform can be stored in into memory 34. When address generator 35 changes address, the next digital waveform sample is presented to the SRAM for storage. When computer 14 commands the LPWB transmit module to start modulating, modulator control logic 29 resets address generator 35 to zero and commands it to start counting in increments of one. SRAM memory modules 34 are put into their "read" mode so the waveform is read out of memory 34 and converted to an analog signal by D/A converter 36.

In the preferred embodiment, two fully programmable (user-defined) analog signals are produced, referred to as "in-phase" and "quadrature" signals. These two analog signals are used by RF transmit processor 25 to generate a 3 MHz amplitude, frequency, or phase modulated signals about a center frequency from 0 to 999 MHz.

RF Transmit Processor Circuit

The block diagram of RF transmit processor 25 circuit is shown in FIG. 9. The primary function of processor 25 is to receive the analog modulation signal from modulator 24, move it to a new frequency band (a process called frequency shifting or up-converting), to produce the excitation signal at the desired center frequency. The preferred embodiment uses a two step conversion process to effectively eliminate unwanted harmonics and images in the up-converted signal. The first conversion is performed by quadrature modulator 43 which uses a local oscillator (LO1) produced by a the first programmable local oscillator Prog LO1 37a. In the preferred embodiment, the quadrature modulator 43 up-converts the 3 MHz wide modulation signal to a fixed 330 MHz intermediate center frequency. The second frequency shift is performed by up converter 44 which uses the a local oscillator (LO2) produced by Prog LO2 37b to up-convert or down-convert the intermediate frequency signal (i.e., output of the quadrature modulator 43) to the center frequency of interest which in the preferred embodiment is between 0–999 MHz.

Figure 10:
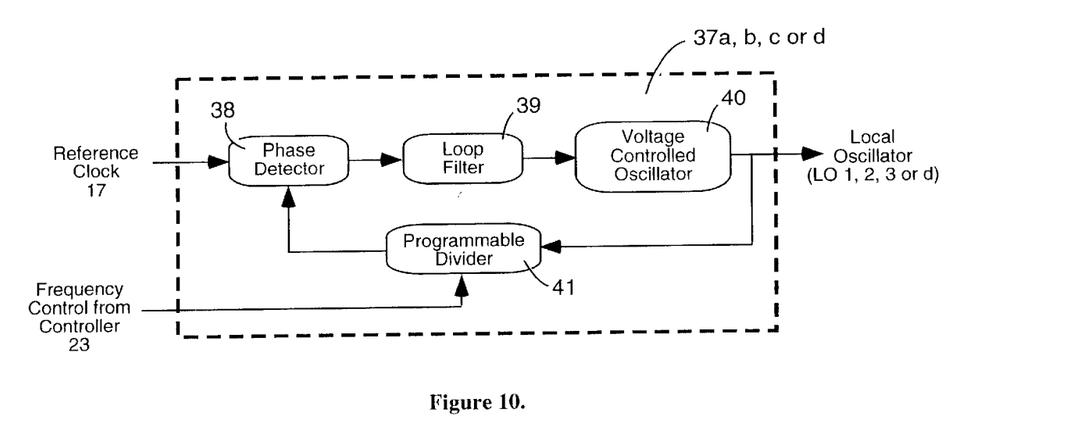
FIG. 10 is a functional block diagram of the preferred embodiment of the programmable local oscillator (Prog. LO) circuit.

A Prog LO (37a or 37b) is a circuit that produces a local oscillator signal comprised of one dominant frequency which is programmable and phase-locked with the digital clock produced by the master oscillator 17. The phase-locking aspect is critical for LPWB system synchronization, which is required for the LPWB processing method to function properly. Prog LO 37a and 37b are alike and only one is shown in FIG. 10. As shown, programmable local oscillator 37a is made up of a combination of a phase detector 38, a loop filter 39, a voltage controlled oscillator (VCO) 40, and a programmable divider 41. VCO 40 is a device that produces a signal whose single frequency output is proportional to the input voltage. The VCO outputs a signal with one dominant frequency. The VCO 40 output signal is frequency divided through the programmable divider 40. The divided signal is compared to the digital clock produced by the master oscillator 17 and an error signal is generated. A loop filter 39 smooths the error signal and commands the VCO to a new frequency. This process in continued until the divider output and digital clock are at the same frequency and phase. When this occurs, the Prog LO output signal is a multiple of the digital clock and is phase-locked to the master oscillator or reference clock 17.

Referring once again to FIG. 9, a quadrature modulator 43 and an up-converter 44 are used to shift the in-phase and quadrature signals to the desired test frequency. A selectable filter array 45 is used to remove any unwanted signals that come from the frequency shifting process and a programmable attenuator or output level control 46 controls the power level of the RF excitation signal. The computer 14 selects the amount of attenuation based upon the required excitation power needed.

LPWB Receiver Module

Figure 11:
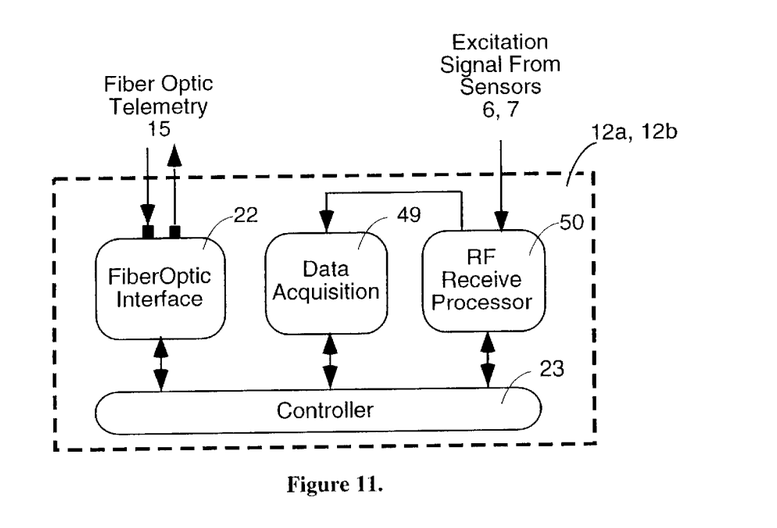
FIG. 11 is a functional block diagram of the preferred embodiment of the LPWB receiver module of this invention.

The preferred embodiment of LPWB receiver module 12a and 12b is shown in FIG. 11. Receiver 12 is comprised of a fiber optic interface 22, a controller 23, a data acquisition 49 and a RF receive processor 50. The fiber optic interface 22 and the controller 23 are identical to the fiber optic interface 22 and controller 23 used in the LPWB synthesizer module 11. The received signal from sensors 6 and 7 are shifted down by RF receive processor 50 and then sampled and stored by data acquisition 49. In the preferred embodiment, LPWB receiver modules 12a and 12b receive signals from sensors 6 and 7 and record a 3 MHz wide signal about a selectable center frequency from 0 to 1000 MHz. The 3 MHz wide signal is sampled at 12 MHz and stored in memory. Upon command from the computer 14, receiver 12 sends the stored baseband signal to computer 14 for processing.

Figure 12:
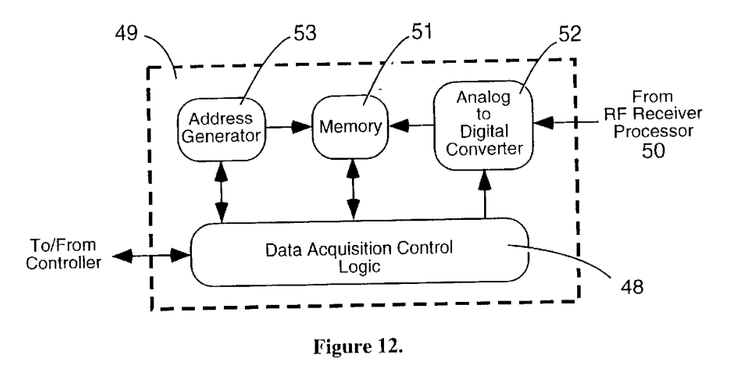
FIG. 12 is a functional block diagram of the preferred embodiment of the data acquisition circuit of this invention as used in the receiver module; and, FIG. 13 is a functional block diagram of the preferred embodiment of the RF receiver processor circuit of this invention as used in the receiver module.
Figure 13:
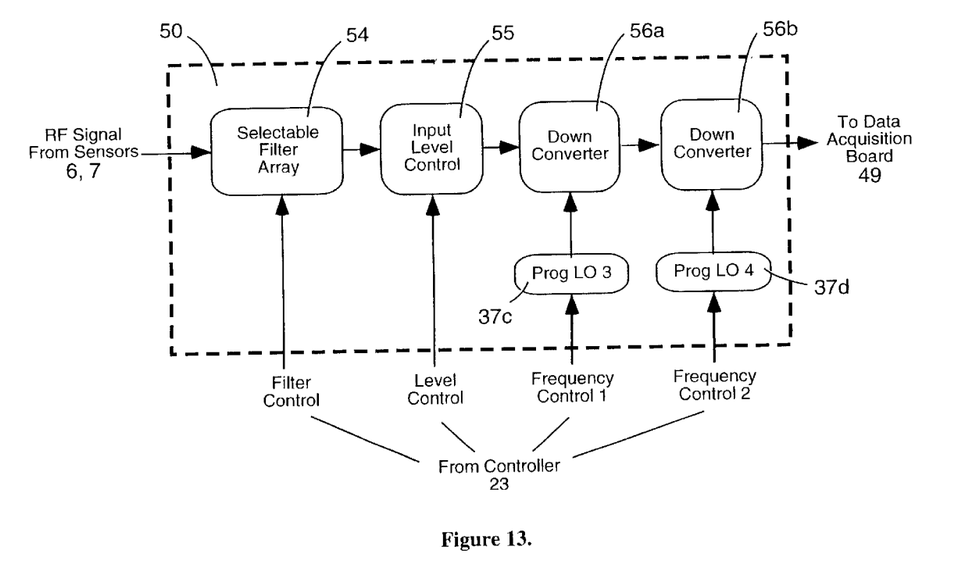

Fiber optic interface 22 circuit is shown in FIG. 6; controller 23 circuit is shown in FIG. 7; data acquisition 49 circuit is shown in FIG. 12; and, RF receive processor 50 circuit is shown in FIG. 13.

Data Acquisition Circuit Board

The block diagram of the data acquisition (DAQ) 49 circuit board is shown in FIG. 12. The primary function of data acquisition circuit 49 is to digitize signals received from RF receiver processor 50, store the data in memory 51, and send the data to the computer 14 when commanded by the computer 14. Data acquisition module 49 has a structure similar to modulator 24.

An analog, down-converted signal is sent from RF receiver processor 50 to data acquisition processor 49. The analog signal is converted, using an analog-to-digital (A/D) converter 52, to digital signal. When the computer 14 commands the LPWB receiver module 12a or 12b to acquire data, data acquisition control logic 48 puts the memory into its "write" mode and commands the address generator 53 to start incrementing. Address generator 53 and memory 51 are the same as those used in the modulator 24, and the memory "reading" and "writing" process is the same as that described for the modulator 24. Analog-to-digital converter (A/D) 52 is triggered by the digital clock produced by the master oscillator 17 that was received by the fiber optic interface 22. When the computer 14 commands the LPWB receiver module 12a or 12b to send the acquired data to computer 14, the data acquisition control circuit 48 puts memory 51 into its "read" mode and sends each digitized sample to controller 23 via the backplane 26.

In the preferred embodiment, the data acquisition module uses a 12 bit A/D converter operating at 12 MHz to sample the 3 MHz information content of the down-converted signal which is centered about 15 MHz as received from the RF receive processor 50. The 12 MHz sampling rate is an exact multiple of the reference clock. Upon command from the computer 14, up to 65.536 bytes are recorded and stored in local memory 51.

RF Receive Processor Circuit

The block diagram of the RF receive processor 50 circuit is shown in FIG. 13. The primary function of RF receive processor 50 is to receive an analog signal from a sensor 6 or 7 and down-convert it to a center frequency compatible with the data acquisition 49 circuit. The preferred embodiment uses a two step conversion process to effectively eliminate unwanted harmonics and images in the down-converted signal. The first conversion is performed by down converter 56a which uses a local oscillator 3 (LO3) generated by programmable local oscillator Prog LO3 37c. The second down-conversion is performed by down converter 56b using LO4 generated by Prog LO4 37d. In the preferred embodiment, the down converter 56a down-converts or up-converts the sensor signal to a fixed 330 MHz intermediate center frequency. The second down converter 56b down-converts the 330 MHz signal to 15 MHz center frequency which is compatible with the data acquisition 49 A/D converter 52.

Based upon the operator's desired test frequency, the computer 14 through the controller 23 determines levels for selectable filter array 54, level control 46, and LO frequencies produced by Prog LO 37c and 37d. Attenuators (input level controllers 55) are used to adjust the signal's power level so the resultant signal sent to analog-to-digital converter 52 has sufficient power. This also ensures that the power level is not too high, which could cause component failure. In the preferred embodiment, the Prog LOs 36c and 37d, shown in FIG. 10, are phase locked with the reference clock 17 and are substantially the same circuits as the Prog LOs 37a and 37b used in RF transmit processor 25.

Stochastic Process Test Technique (SPTT) Algorithms

Signal processing software is an integral and fundamental part of the low-power/wideband or LPWB system. The collection of employed algorithms is called "stochastic process test technique" or "SPTT". SPTT exploits the stationary random nature of the excitation source to estimate a transfer function. It improves confidence in the transfer function estimate by using robust signal processing algorithms, such as cross-correlation, to reject signals that are uncorrelated such as noise due to the test setup or the measurement system itself. The SPTT processing limitation is determined primarily by the number of A/D samples and desired frequency resolution. Confidence in the transfer function can be improved by increasing the sampling window and allowing for more averaging. This allows use of lower power excitation sources, even ambient radiators, for estimating a transfer function.

A unique feature of SPTT, not practical with prior art, is the estimation of a coherence function which determines the degree of correlation between the reference measurement and the system response measurement. At frequencies for which coherence the function is near one, confidence in the accuracy of the transfer function estimate is high and, conversely, when the coherence function is near zero, then the confidence in the transfer function estimate is low. The coherence measure can be used to increase the number of averaging or increase the excitation power until confidence in the transfer function is acceptably high.

LPWB apparatus includes both "non-parametric" as well as "parametric" SPTT algorithms. The "non-parametric" methods assume no prior knowledge of the system under test 2 and, therefore, are applicable to any system under test. Examples of non-parametric SPTT techniques include: discrete Fourier transform (DFT), Welch method, Barlette method, and the coherence function. The "parametric" techniques, on the other hand, assume some specific knowledge of the system under test (e.g. physical constraints on system responses) resulting in faster and more efficient algorithms. Examples of parametric SPTT techniques include: Prony method, Pole/Zero model, and adaptive filtering.

The preferred embodiment of the non-parametric transfer function estimation technique uses the Welch method with no overlap (also referred to as the Bartlett method) to estimate the cross-correlation of each measurement. The Welch and Bartlett methods are described in detail in "Engineering Applications of Correlation and Spectral Analysis", by Julius Bendat & Allan Piersol, 2nd Edition, 1993, Publisher John Wiley & Sons, New York, N.Y. pages 71–76. The primary processing steps of this non-parametric technique are:

1) Each receiver's digitized measurements are divided into smaller sections. For example, if 8192 A/D samples were acquired, then the measurement might be divided into 16 sections of 512 samples per section.
2) For each section, the data is convolved with a window function to smooth out the sharp discontinuities of the edges of each section. A number of window functions can be used, such as Hanning, Hamming, Cosine taper, Kaiser, Bartlett, and Blackman. The preferred embodiment uses a Hanning window.
3) Each section's data is then decomposed into its spectral components. This is done using a discrete Fourier transform (DFT) algorithm.
4) The reference (input signal 1) receiver's DFT data is multiplied by its complex conjugate, which produces the square of the magnitude of the DFT data. This is called the auto-power spectrum of the reference.
5) The response (output signal 3) receiver's DFT data is multiplied by its complex conjugate, which produces the square of the magnitude of the DFT data. This is called the auto-power spectrum of the response.
6) The response's DFT data is multiplied by the complex conjugate of the excitation's DFT data. This is called the cross-power spectrum.
7) Steps 2 through 6 are repeated for each data section.
8) The results from each section are added together. This gives a sum of the auto-power spectrum of the reference, a sum of the auto-power spectrum of the response, and a sum of the cross-power spectrum.
9) The "transfer function" estimate is the cross-power spectrum divided by the auto-power spectrum of the reference.
10) The "coherence function" estimate is the square of the cross-power spectrum divided by the product of the auto-power spectrum of the reference and the auto-power spectrum of the response.

The processing steps of the parametric transfer function estimation technique are:

1) Choose a model for the transfer function. The model parameters are unknown and are determined in the following steps.
2) Each receiver's digitized measurements are processed by the parametric algorithm.
3) The parametric algorithm can include the least squares method, Pade approximation, Prony's method, iterative prefiltering, or adaptive filtering. The parametric algorithm estimates the parameters of the model.
4) The model and its parameters represent the estimated transfer function.

The least squares method, Pade approximation, Prony's method, and iterative prefiltering methods are described in detail in "Statistical Digital Processing and Modeling", by Monson H. Hayes, 1st Edition, 1996, Publisher John Wiley & Sons, New York, N.Y. pages 129–203.

Adaptive filtering methods are described in detail in "Statistical Digital Processing and Modeling", by Monson H. Hayes, 1st Edition, 1996, Publisher John Wiley & Sons, New York, N.Y. pages 493–554.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same result are within the scope of this invention.

What is claimed is:

1. A method of acquisition and signal transmission through a plurality of spatially distributed locations comprising the steps of:
   a) exciting at a low power a physical system with a wide band excitation signal as an input signal;
   b) locating a data recorder/processor at spatially distributed locations;
   c) interconnecting each said spatially distributed data recorder/processor to an acquisition control computer using a telemetry network;
   d) sending a frequency synchronization signal through said telemetry network;
   e) simultaneously receiving and recording said wide band excitation input signal in said data recorders/processors at each spatially distributed location;
   f) sending said recorded wide band excitation input signals to said acquisition control computer via said telemetry network; and,
   g) using a stochastic process to derive from said recorded wide band excitation input signals a system transfer function for said physical system over the width of said wide band excitation signal.

2. The method of claim 1 wherein only a single data recorder/processor is used.

3. The method of claim 1 wherein two data recorders/processors are used.

4. The method of claim 1 wherein three or more data recorders/processors are used.

5. The method of claim 1 wherein said telemetry network uses digital signals.

6. The method of claim 1 wherein said telemetry network uses analog signals.

7. The method of claim 1 wherein said telemetry network uses fiber optics links.

8. The method of claim 1 wherein said telemetry network uses radio frequency or microwave links.

9. The method of claim 1 wherein said telemetry network uses optical links.

10. The method of claim 1 wherein said telemetry network uses hard wire links.

11. The method of claim 1 wherein said telemetry network uses a daisy chain architecture.

12. The method of claim 1 wherein said telemetry network uses a star architecture.

13. The method of claim 1 wherein said frequency synchronization signal is integrated with said received and recorded wide band excitation input signals to produce a single signal transmitted through said telemetry network.

14. The method of claim 13 wherein said integration is performed via pulse width modulation.

15. The method of claim 13 wherein said integration is performed via frequency division multiplexing.

16. The method of claim 13 wherein said integration is performed via time division multiplexing.

17. The method of claim 13 wherein said frequency synchronization signal is not integrated with the wide band excitation input signal so that two separate signals are transmitted through the said telemetry network.

18. The method of claim 1 wherein said frequency synchronization signal is not integrated with said received and recorded wide band excitation input signals so that two separate signals are transmitted through said telemetry network.

19. The method of claim 1 wherein said spatially distributed data recorders/processors down-convert the received wide band excitation input signals.

20. The method of claim 1 wherein said spatially distributed data recorders/processors store the received signals in digital format.

21. The method of claim 1 wherein said spatially distributed data recorders/processors store the received signals in analog format.

22. The method of claim 1 further including the step of inserting one or more waveform synthesizers in said telemetry network.

23. The method of claim 22 wherein said one or more waveform synthesizers synthesizes a modulated signal about a specified center frequency.

24. The method of claim 23 wherein said one or more waveform synthesizers synthesizes a modulated signal about a specified center frequency.

25. The method of claim 23 wherein said modulated signal is fully programmable.

26. The method of claim 23 wherein said modulated signal is frequency modulated.

27. The method of claim 23 wherein said modulated signal is amplitude modulated.

28. The method of claim 23 wherein said modulated signal is phase modulated.

29. The method of claim 22 wherein said one or more waveform synthesizer uses up-conversion to shift the modulated signal and specified center frequency to a new frequency about a new specified center frequency.

30. A method of estimating the transfer function of a system comprising the steps of:
   a) exciting at a low power said system with wide band excitation signals as input signals;
   b) distributing data recorders/processors at various locations about said system;
   c) interconnecting each said data recorder/processor to an acquisition control computer using a telemetry network;
   d) sending a frequency synchronization signal through said telemetry network;
   e) simultaneously receiving and recording said wide band excitation input signals and said frequency synchronization signal in said data recorders/processors at each said location;
   f) sending said recorded wide band excitation input signals and said frequency synchronization signal to said acquisition control computer via said telemetry network; and,
   g) analyzing said recorded wide band excitation input signals using stochastic processing techniques to estimate the system transfer function.

31. The method of claim 30 wherein said system is not physically distributed.

32. The method of claim 30 wherein said wide band excitation input signals consist of ambient radiation.

33. Apparatus for obtaining data for measuring the transfer function of a physical system comprising:
   a) a waveform synthesizer for generating a synthesized low-power, wide band waveform signal and exciting said physical system with said synthesized low-power, wide band waveform signal as an input signal;
   b) a first data recorder/processor for sampling said synthesized low-power, wide band waveform signal;
   c) second and third data recorders/processors located at spatially distributed locations within said physical system;
   d) digital fiber optic telemetry for digitally interconnecting each of said first, second and third data recorders/processors and said waveform synthesizer;
   e) an acquisition control computer connected to said first, second. and third data recorders/processors and said waveform synthesizer in a network arrangement;
   f) a synchronization signal generator connected to said network arrangement; and,
   g) controller means for simultaneously commanding said waveform synthesizer to broadcast said synthesized low-power, wide band waveform signal to excite the physical system and to send a synchronization signal through said network arrangement to cause said first data recorder/processor to sample said synthesized low-power, wide band waveform signal, to cause said second and third data recorders/processors to measure and record the signals received in said physical system from said low-power, wide band input signal, and to cause said first, second and third recorders/processors to convert said measured and recorded signals received therein to digital format and to send said digital format in synchronized form through said network arrangement to said acquisition control computer for later processing in said acquisition control computer to compute a transfer function.

34. The apparatus of claim 33 wherein said waveform synthesizer synthesizes a fully programmable 3 MHz modulated excitation signal about a center frequency located in the range of about 0–999 MHz.

35. The apparatus of claim 34 wherein said waveform synthesizer is adapted up-convert the modulated excitation signal to a modulated excitation signal about a specified center frequency.

36. The apparatus of claim 35 wherein said data recorders/processors use a two-step, down-conversion technique for shifting said excitation signal to a 15 MHz center frequency.

37. The apparatus of claim 35 wherein said data recorders/processors use a 12-bit analog-to-digital converter sampled at 12 MHz to digitize and store said excitation signal.

38. The apparatus of claim 33 wherein said waveform synthesizer is adapted to generate a frequency modulated excitation signal.

39. The apparatus of claim 33 wherein said data recorders/processors can record a 3 MHz wide modulated signal centered about any frequency from 0–999 MHz.

40. The apparatus of claim 33 wherein said network arrangement is configured as a daisy chain digital fiber optics network arrangement.

41. The apparatus of claim 33 wherein said synchronization signal generator is a 3 MHz local oscillator.

42. The apparatus of claim 33 wherein said synchronization signal is transmitted through said interconnected digital fiber optic telemetry with an analog bandwidth of 125 MHz.

43. The apparatus of claim 33 wherein said synchronization signal is integrated with said signal received in said physical system from said synthesized low-power, wide band waveform signal using pulse width modulation.

44. A method of excitation, acquisition and signal transmission through a plurality of spatially distributed locations comprising the steps of:
   a) exciting at a low power a physical system with a wide band excitation signal as an input signal;
   b) locating a data recorder/processor at spatially distributed locations;
   c) interconnecting each said spatially distributed data recorder/processor to an acquisition control computer using a telemetry network;
   d) sending a frequency synchronization signal through said telemetry network;
   e) simultaneously receiving and recording said wide band excitation input signal in said data recorder/processor at each spatially distributed location
   f) sending said recorded wide band excitation input signals to said acquisition control computer via said telemetry network; and,
   g) using a stochastic process to derive from said recorded signals a system transfer function for said physical system over the width of said wide band excitation signal.

45. The method of claim 44 including the further step of storing said simultaneously received and recorded wide band excitation input signal in said data recorder/processor at each spatially distributed location.

46. The method of claim 44 wherein said telemetry network is selected from the group consisting of fiber optic links, radio frequency links, microwave links, optical links and hard wiring links.

47. The method of claim 44 wherein said telemetry network is selected from the group consisting of daisy chain architecture and star architecture.

* * * * *

UNITED STATES PATENT AND TRADEMARK OFFICE
CERTIFICATE OF CORRECTION

PATENT NO. : 6,526,365 B1  Page 1 of 1
DATED : February 25, 2003
INVENTOR(S) : Michael A. Marino, Parviz Parhami and John T. Robinson It is certified that error appears in the above-identified patent and that said Letters Patent is hereby corrected as shown below:

<u>Column 1,</u>
Line 7, insert:

-- This invention was made with Government support under F29601-95-C-0030 awarded by U.S. Air Force. The Government has certain rights in the invention. --

Signed and Sealed this

Twenty-second Day of April, 2003

JAMES E. ROGAN
*Director of the United States Patent and Trademark Office*